(12) United States Patent
Qiu et al.

(10) Patent No.: US 6,639,340 B1
(45) Date of Patent: Oct. 28, 2003

(54) METHOD FOR MANUFACTURING PIEZOELECTRIC ELEMENT, AND PIEZOELECTRIC ELEMENT, INK-JET RECORDING HEAD AND PRINTER

(75) Inventors: Hong Qiu, Beijing (CN); Koji Sumi, Nagano (JP); Souichi Moriya, Nagano (JP); Masato Shimada, Nagano (JP); Tsutomu Nishiwaki, Nagano (JP)

(73) Assignee: Seik Epson Corporation, Tokyo (JP)

( * ) Notice: Subject to any disclaimer, the term of this patent is extended or adjusted under 35 U.S.C. 154(b) by 0 days.

(21) Appl. No.: 09/549,209

(22) Filed: Apr. 13, 2000

(30) Foreign Application Priority Data

Apr. 13, 1999 (JP) .......................................... 11-105803
Mar. 30, 2000 (JP) ........................................ 2000-094184

(51) Int. Cl.7 ............................................. H01L 41/08
(52) U.S. Cl. ................................. 310/358; 310/328 H
(58) Field of Search ........................ 310/328, 330–332, 310/357, 358, 359

(56) References Cited

U.S. PATENT DOCUMENTS 5,691,752 A * 11/1997 Moynihan et al. ............ 347/68
6,051,914 A * 4/2000 Nishiwaki .................... 310/358
6,255,762 B1 * 7/2001 Sakamaki et al. ........... 310/358
6,328,433 B1 * 12/2001 Moriya et al. ................ 347/68
6,411,017 B1 * 6/2002 Qiu et al. .................... 310/358

FOREIGN PATENT DOCUMENTS

EP  0 676 384 A2  10/1995
EP  0 689 249 A2  12/1995
EP  0 736 915 A1  10/1996

* cited by examiner

*Primary Examiner*—Mark Budd
(74) *Attorney, Agent, or Firm*—Sterne, Kessler, Goldstein & Fox, P.L.L.C.

(57) ABSTRACT

Provided is a method for manufacturing a piezoelectric element that has excellent piezoelectric characteristics and can be made into a thicker film. A piezoelectric thin film is crystallized by a process in which piezoelectric precursor films 4021 through 4025 containing the metal elements of a piezoelectric ceramic are coated with a material, dried, pyrolyzed, and then heat-treated under prescribed conditions in a diffusion furnace. With this method, a piezoelectric thin film can be made into a thicker film without initiating cracking.

11 Claims, 11 Drawing Sheets

PRINTER

METHOD FOR MANUFACTURING PIEZOELECTRIC ELEMENT, AND PIEZOELECTRIC ELEMENT, INK-JET RECORDING HEAD AND PRINTER

BACKGROUND OF THE INVENTION

1. Field of the Invention

The present invention relates to a piezoelectric element that demonstrates a piezoelectric effect or a converse piezoelectric effect, and to a product featuring same, and more particularly to an improved manufacturing method that allows heretofore unattainable increases in the thickness of piezoelectric thin films to be achieved, and to a thin-film structure obtained by this manufacturing method.

2. Description of the Related Art

Piezoelectric ceramics have electromechanical conversion action. Piezoelectric elements are constructed by sandwiching piezoelectric thin films, which consist of such piezoelectric ceramic crystals, between electrodes.

In conventional practice, piezoelectric thin film precursors are commonly formed using a sol-gel technique or the like, and the piezoelectric thin films are ultimately crystallized by heat treatment at high temperatures.

Such heat treatments cause columnar crystals to grow from the bottom electrode inside the precursor films, yielding high-quality crystalline piezoelectric thin films having prescribed piezoelectric characteristics.

When crystallized by conventional high-temperature heat treatments, however, piezoelectric thin films are apt to crack, and are therefore disadvantageous in that they cannot be formed in a prescribed thickness (for example, 1 μm or greater).

Such cracking is attributed to the fact that when crystals gradually grow in a piezoelectric precursor film, stress is applied in the direction parallel to the direction of film surface, splitting the crystals in the film.

In view of these drawbacks, a first object of the present invention is to provide a method for manufacturing a piezoelectric element and an ink-jet recording head in which the piezoelectric thin films can be made thicker.

A second object of the present invention is to provide a piezoelectric element formed from a thick film and provided with excellent piezoelectric characteristics, and to provide an ink-jet recording head and printer equipped with this piezoelectric element.

SUMMARY OF THE INVENTION

The method for manufacturing a piezoelectric element aimed at attaining the first object is a method for manufacturing a piezoelectric element having electromechanical conversion action, wherein this method for manufacturing a piezoelectric element comprises crystallizing a piezoelectric thin film by a process in which a piezoelectric precursor film containing the metal elements of a piezoelectric ceramic is heat-treated in a diffusion furnace.

The heat treatment in the diffusion furnace should preferably be performed by passing a reaction gas, and oxygen in particular, in a direction roughly parallel to the substrate surface provided with the piezoelectric precursor film. This is because aligning the substrate parallel to the oxygen stream allows a large number of such substrates to be lined up inside the diffusion furnace, and the oxygen to be fed uniformly in relation to the substrates. The cost can be reduced because a large number of substrates can be heat-treated together.

The heat treatment in the aforementioned diffusion furnace should preferably be performed every time piezoelectric precursors are stacked 0.1 to 0.5 μm. Heat-treating the piezoelectric precursors every time they are stacked 0.2 to 0.4 μm is particularly preferred.

A single cycle of heat treatment in the diffusion furnace may, for example, be performed for 10 to 60 minutes at 500 to 800° C.

The piezoelectric element aimed at attaining the second object is provided with one or more layers in which fine crystal grains are present in a prescribed density (for example, $1.4 \times 10^5$ cm$^{-1}$) parallel to the film surface. In particular, the fine crystal grains should preferably have an annular shape.

In addition, the piezoelectric thin film for the piezoelectric element of the present invention should preferably have columnar crystal grains and fine crystal grains; each columnar crystal grain should extend in the direction of film thickness, and a plurality thereof should be aligned in the direction of film surface, yielding a layer of columnar crystal grains; and a plurality of such columnar crystal grain layers should be stacked in the direction of film thickness, yielding layers in which a plurality of fine crystal grains are aligned parallel to the film surface between the aforementioned layers. Another preferred option is for the fine crystal grains to be formed along the grain boundaries between the layers of columnar crystal grains and to be disposed along the borders between the layers. The presence of such fine crystal grains is believed to act as a buffer between the crystals and to have a crack-preventing effect.

In the piezoelectric thin film, the ratio of the mean grain size of the columnar crystal grains to the thickness of the piezoelectric thin film is set to 0.1 or lower. In other words, the piezoelectric thin film is fashioned to a thickness ten or more times greater than the grain size of the columnar crystal grains.

The mean grain size of the fine crystal grains is set to 50 nm or less. Each of the layers containing fine crystal grains has a thickness of 50 nm or less, as measured from the grain boundaries of the crystals. Layers containing fine crystal grains are present along the borders formed by a heat treatment in a diffusion furnace or the like.

Lattice-defect layers containing dislocations and lattice strain are present along the layers containing fine crystal grains. The thickness of such layers is 20 nm or less.

The present invention resides in an ink-jet recording head in which the piezoelectric element of the present invention is used as a piezoelectric actuator.

The present invention also resides in a printer in which the ink-jet recording head of the present invention is used as a printing means.

In the drawings, 10 is a nozzle plate, 11 is a nozzle, 20 is a pressure chamber substrate, 21 is a cavity, 22 is a side wall, 30 is a diaphragm, 40 is a piezoelectric element, 401 is a bottom electrode, 402 is a piezoelectric thin film, 403 is a top electrode, 404 is a columnar crystal grain, 405 is a fine crystal grain, 406 is a lattice-defect layer, and 4021 through 4025 are heat-treatment layers.

DESCRIPTION OF THE PREFERRED EMBODIMENTS

Embodiments of the present invention will now be described with reference to drawings.

Figure 1:
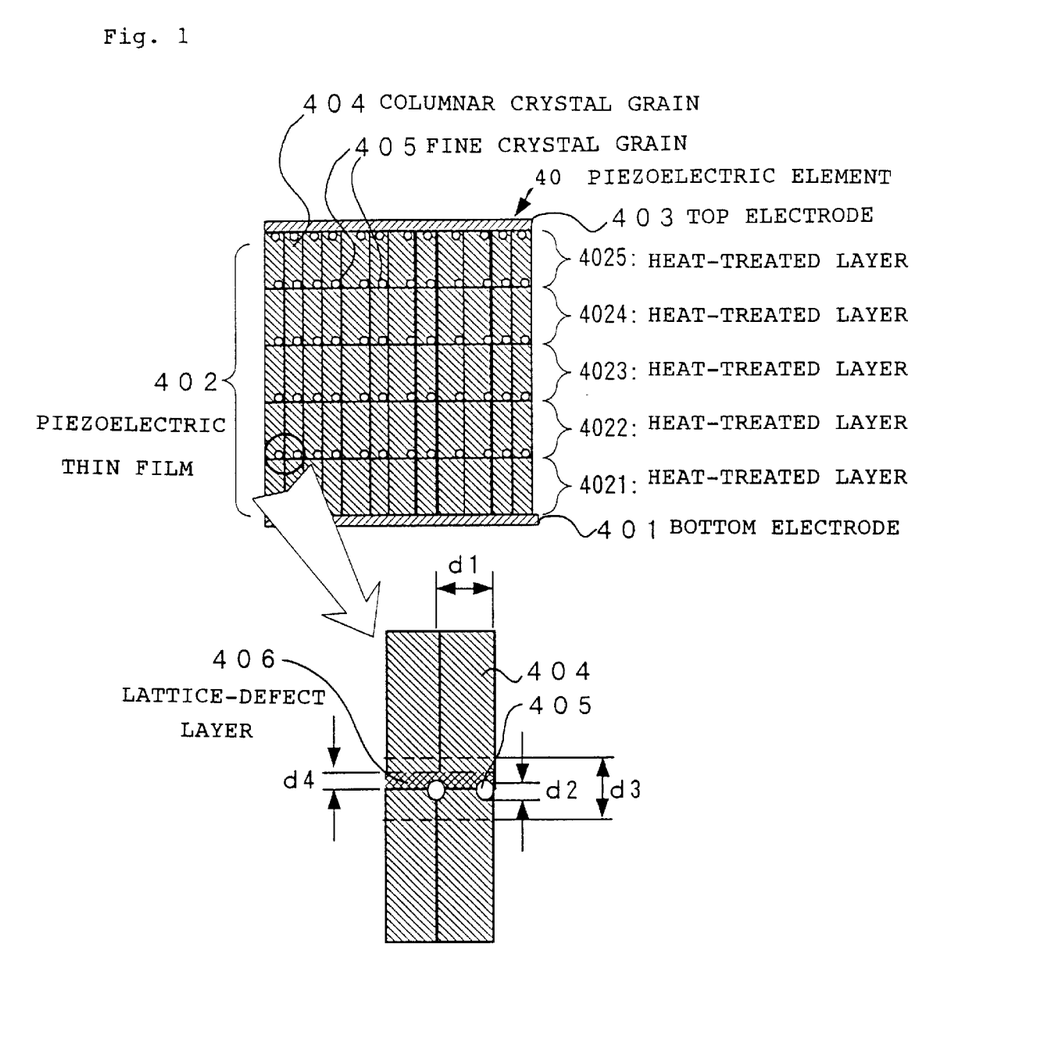
FIG. 1 is a cross section of the layered structure of the piezoelectric element in accordance with the present invention.

FIG. 1 is a cross section depicting the layered structure of a piezoelectric element formed by the manufacturing method of the present invention.

The piezoelectric element 40 of the present embodiment is obtained by sandwiching a piezoelectric thin film 402 between a bottom electrode 401 and a top electrode 403, as shown in FIG. 1.

The bottom electrode 401 and top electrode 403 are a pair of electrodes designed to apply voltage to the piezoelectric thin film 402 and formed from platinum or another electro-conductive material. A titanium layer or another adhesive layer may also be provided between the bottom electrode 401 and the mounting surface in order to ensure proper bonding with the surface for mounting the piezoelectric element 40.

The piezoelectric thin film 402, which is a piezoelectric ceramic crystal composed of a liquid piezoelectric precursor (sol) of a metal alkoxide solution, comprises a plurality of heat-treated layers 4021 through 4025. The final crystallized composition of the piezoelectric thin film is appropriately selected, for example, from lead zirconate titanate (PZT), other ferroelectric piezoelectric materials, and materials obtained by adding niobium, nickel, magnesium, and other metals thereto. The selection is made with consideration for the characteristics, applications, and other attributes of the piezoelectric element. Specifically, the piezoelectric thin film 402 may be composed of lead titanate ($PbTiO_3$), lead titanate zirconate ($Pb(Zr, Ti)O_3$), lead zirconate ($PbZrO_3$), lead lanthanum titanate (($Pb, La), TiO_3$), lead lanthanum zirconate titanate (($Pb, La)(Zr, Ti)O_3$), lead zirconium titanate magnesium niobate ($Pb(Zr, Ti)(Mg, Nb)O_3$), and the like.

In particular, the piezoelectric thin film 402 of the present invention has the following structural features.

1) Fine crystal grains 405 are present parallel to the film surface in a minimum prescribed density (for example, $1.4 \times 10^5$ $cm^{-1}$).
2) The ratio of the mean grain size d1 of columnar crystal grains 404 to the thickness of the piezoelectric thin film is set to 0.1 or lower.
3) The mean grain size d2 of the fine crystal grains 405 is set to 50 nm or less.
4) Each of the layers containing the fine crystal grains 405 has a thickness d3 of 50 nm or less.
5) Lattice-defect layers 406 containing dislocations and lattice strain and having a thickness d4 (20 nm or less) are present along the layers having the fine crystal grains 405.

These characteristics are the structural characteristics observed in piezoelectric thin films formed using the manufacturing method in which a diffusion furnace is used in accordance with the present invention.

The heat-treated layers 4021 through 4025 constituting the piezoelectric thin film 402 are crystallized layers obtained using a diffusion furnace. The fine crystal grains 405 are produced at the borders formed during the heat treatment in the diffusion furnace, and are present along the borders and in the uppermost portions of heat-treated layers as formations sandwiched between the grain boundaries of the columnar crystal grains 404. As a result of the heat treatment in the diffusion furnace, the piezoelectric thin film 402 is thicker than a conventional product and can be formed to a thickness of 2 $\mu$m or greater.

Figure 2:
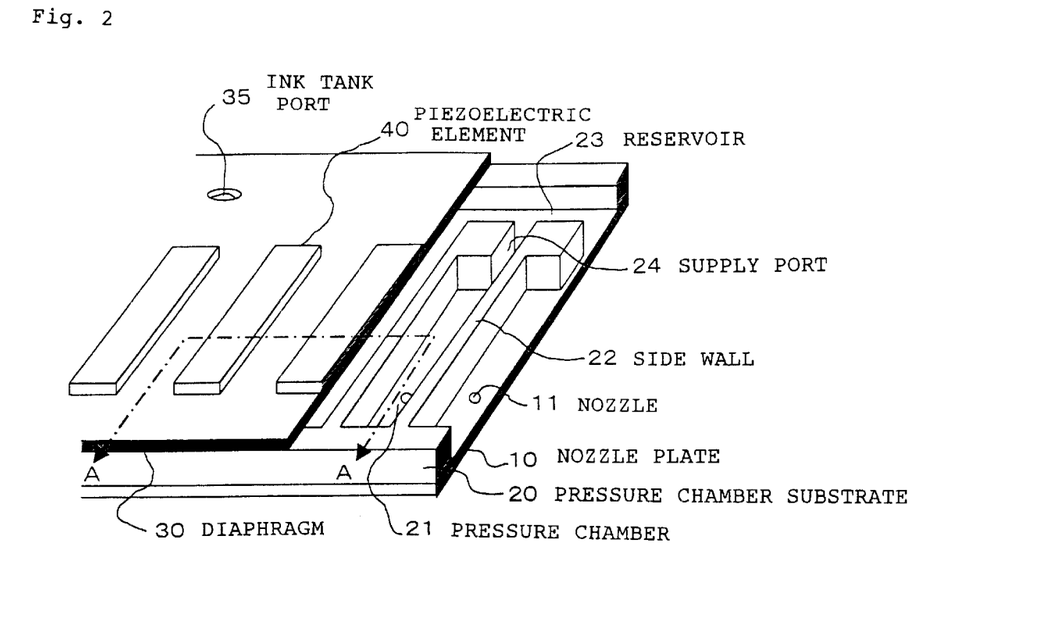
FIG. 2 is a fragmentary cross section of the principal part of the ink-jet recording head in accordance with the present invention.

FIG. 2 is a fragmentary cross section of an ink-jet recording head provided with the above-described piezoelectric element as a piezoelectric actuator.

As shown in FIG. 2, the ink-jet recording head 1 comprises a nozzle plate 10, a pressure chamber substrate 20, a diaphragm 30, and piezoelectric elements 40 in a housing (not shown).

The pressure chamber substrate 20 comprises pressure chambers (cavities) 21, which are formed by etching a silicon monocrystal substrate or the like. The pressure chambers 21 are provided with spatial configurations that allow ink or the like to be stored before being expelled. The pressure chambers 21 are separated from each other by side walls 22. Ink is fed to the pressure chambers 21 from a reservoir 23 via supply ports 24. The reservoir 23 is filled with the ink from an ink tank (not shown) through an ink tank port 35 provided to the diaphragm 30.

The diaphragm 30 is formed on one side of the pressure chamber substrate 20, and the piezoelectric elements 40 are provided at locations that correspond to the pressure chambers 21. An oxide film (silicon dioxide film) is suitable as the diaphragm 30 because it is elastic and has insulating properties and mechanical strength.

The nozzle plate 10 is disposed on the opposite side from the diaphragm 30 of the pressure chamber substrate 20. The nozzle plate 10 is provided with nozzles 11 at locations that correspond to the individual pressure chambers 21.

The above-described ink-jet recording head is not limited by the structure of the present embodiment and can have any structure in which piezoelectric elements are used as piezoelectric actuators.

In the above-described structure of the ink-jet recording head 1, applying a voltage between the electrodes to create strain in the piezoelectric elements 40 causes the diaphragm 30 to be deformed in accordance with the strain. Pressure is applied by this deformation to the ink inside the pressure chambers 21, causing the ink to be expelled through the nozzles 11.

Figure 3:
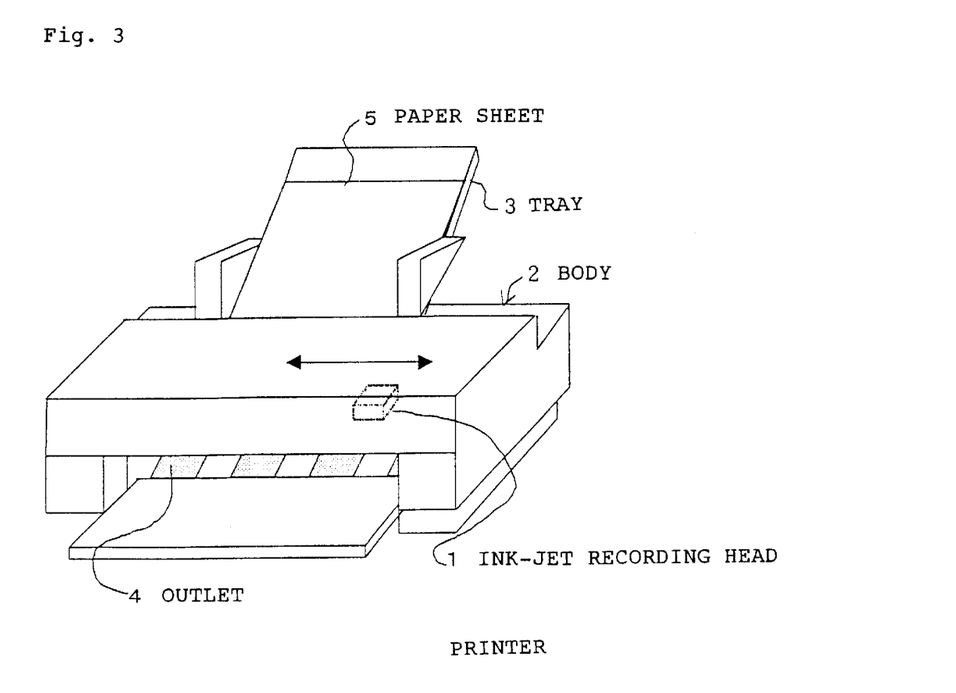
FIG. 3 is a block diagram of the printer.

FIG. 3 is a perspective view of a printer in which the above-described ink-jet recording head 1 is used as a printing means.

As shown in FIG. 3, the printer comprises a tray 3 and an outlet 4 in a printer body 2. The body 2 houses the ink-jet recording head 1 of the present invention. The body 2 is provided with the ink-jet recording head 1 such that reciprocating action is enabled across the paper sheets 5 fed from the tray 3 by a paper feed mechanism (not shown). The outlet 4 is designed to discharge printed paper sheets 5.

Manufacturing Method

Figure 4:
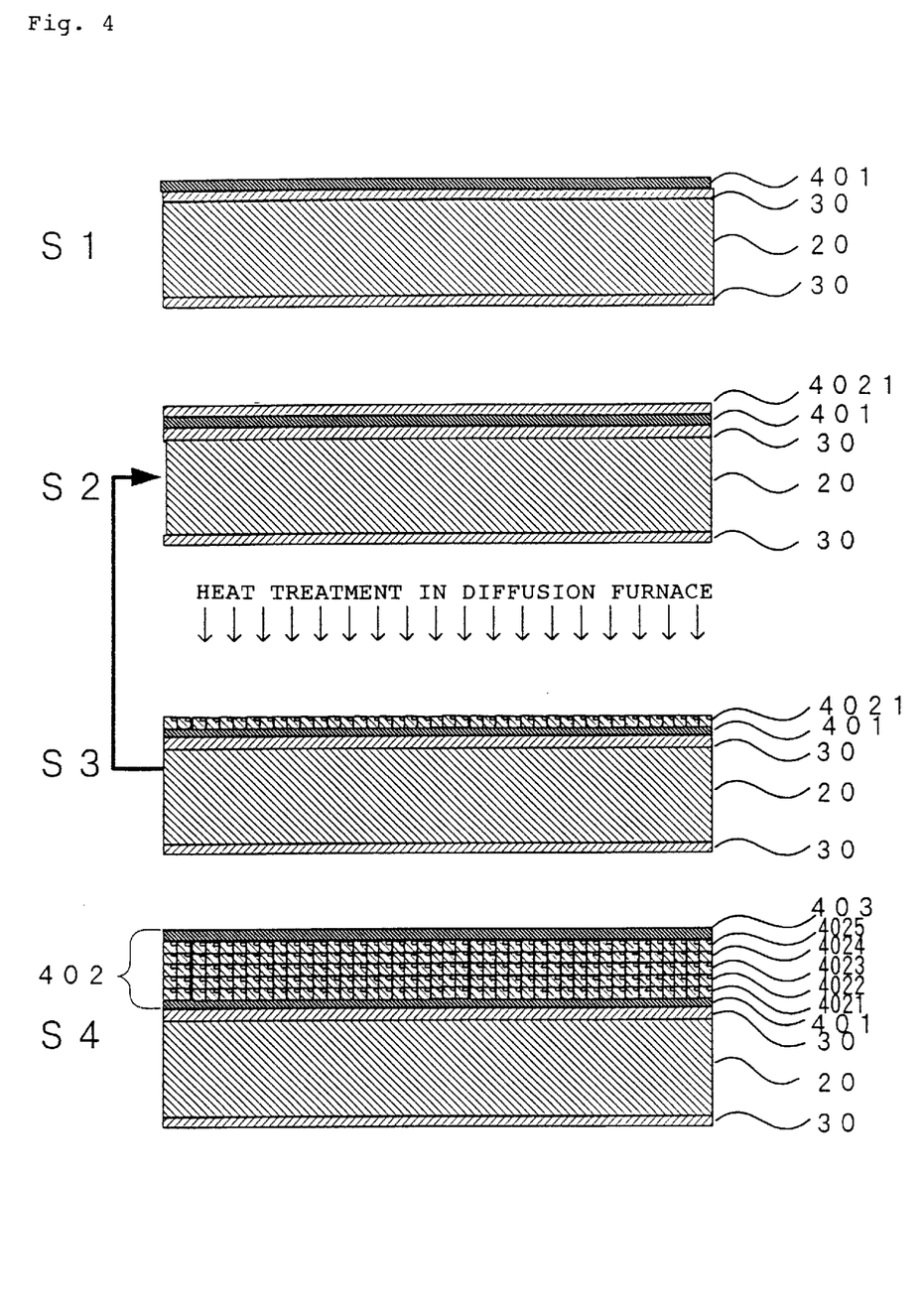
FIG. 4 is a cross section of the steps for manufacturing the piezoelectric element, where S1 is a step for manufacturing a bottom electrode, S2 is a step for forming a piezoelectric precursor film, S3 is a step for performing a heat treatment in a diffusion furnace, and S4 is a step for forming a top electrode.
Figure 5:
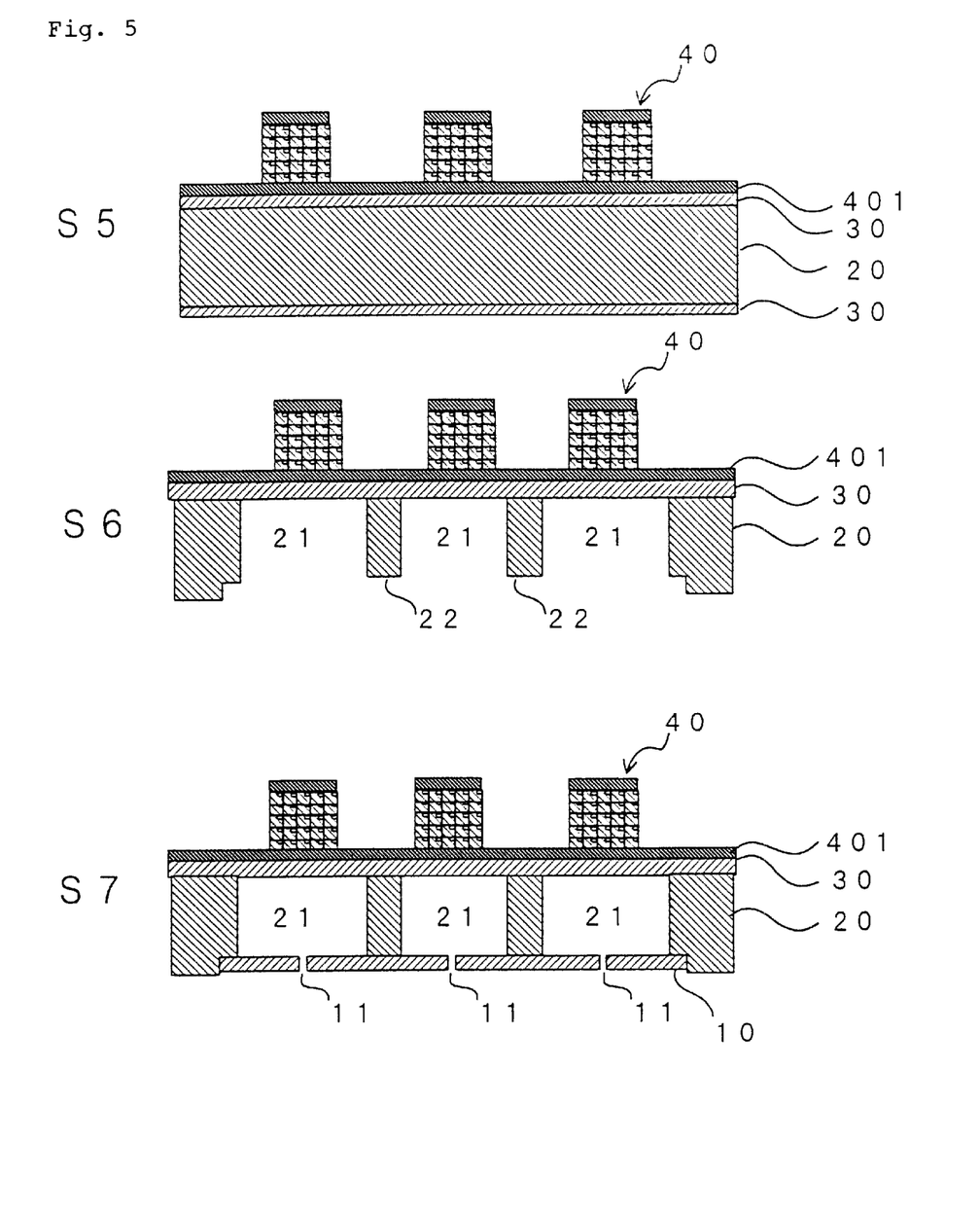
FIG. 5 is a cross section of the steps for manufacturing the ink-jet recording head, where S5 is a dry etching step, S6 is a wet etching step, and S7 is a nozzle plate bonding step.

The method for manufacturing a piezoelectric element and an ink-jet recording head in accordance with the present invention will now be described. FIGS. 4 and 5 below are cross sections of manufacturing steps illustrated using a crosscut along surface A—A in FIG. 2.

Step for Forming the Diaphragm and the Bottom Electrode (S1): In this step, a diaphragm 30 and a bottom electrode 401 are formed on the surface of a silicon monocrystal substrate 20.

A silicon monocrystal substrate having a prescribed thickness (for example, 220 μm) is used as a base for the pressure chamber substrate 20. A diaphragm 30 consisting of an oxide film is first formed on the silicon monocrystal substrate. A commonly used thermal oxidation technique or the like may be used to form the oxide film. Specifically, a high-temperature treatment may be performed in an oxidizing atmosphere containing oxygen or water vapor. A thermally oxidized film composed of silicon dioxide ($SiO_2$) is thereby formed as the diaphragm 30. CVD may be used instead of a thermal oxidation technique. The diaphragm 30 is fashioned to a thickness suitable for a diaphragm (for example, 1.0 μm).

As the next step, a bottom electrode 401 is formed on the diaphragm 30. Electron beam vapor deposition, sputtering, or the like may be used as the film forming technique. Platinum, iridium, or another electroconductive material may be used as the sputtering material. The thickness of the bottom electrode is about 100 to 400 nm.

Step for Forming Piezoelectric Thin Film (S2, S3): In this step, a piezoelectric precursor film is formed by a sol-gel technique, and crystallization is promoted by a heat treatment in a diffusion furnace.

First, an organometallic alkoxide solution is prepared to obtain a stoichiometric ratio of the metal elements contained in the final composition. For example, the solution is prepared in a Pb:Zr:Ti ratio of 100:56:44 when the PZT of the final composition is $PbZr_{0.56}Ti_{0.44}O_3$. This solution is applied in a prescribed thickness to the bottom electrode 401 by spin coating or another application technique.

The coated product is dried in an oven at a prescribed temperature (for example, about 180° C.) for a prescribed time (for example, about 10 minutes) to vaporize the solvent. The dried product is pyrolyzed using a hot plate or the like in the atmosphere at a prescribed temperature (for example, about 400° C.) for a prescribed time (for example, about 10 minutes) to vaporize the organic ligands coordinated to the metal, yielding a metal oxide. The cycle of sol coating, drying, and pyrolyzing is repeated a prescribed number of times (for example, six times), yielding a piezoelectric precursor film comprising six layers (S2).

Figure 6:
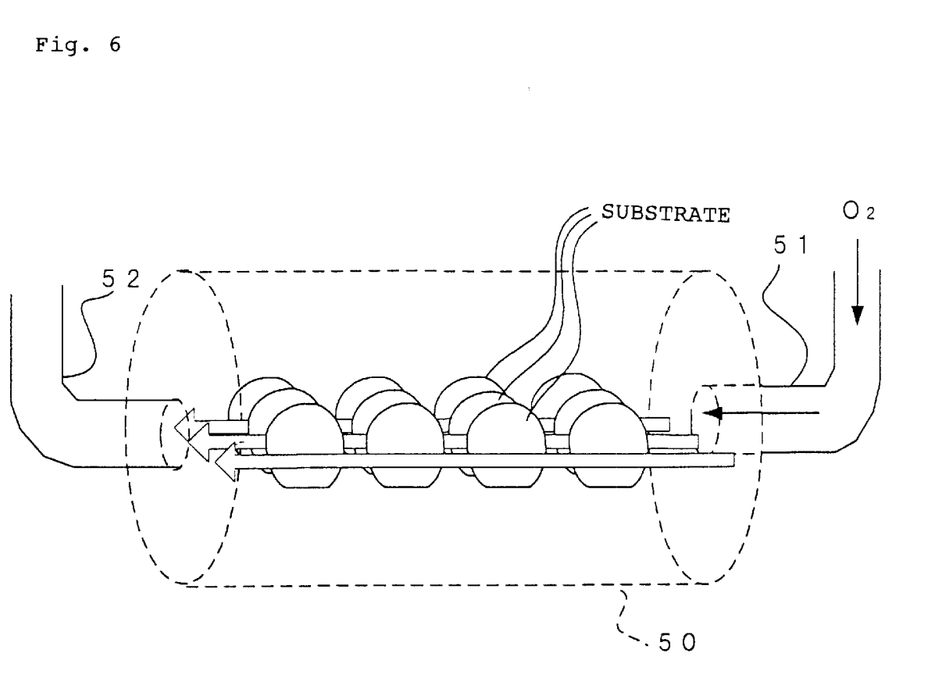
FIG. 6 is a diagram illustrating the relation between the oxygen stream and the substrate position in the step for performing a heat treatment in a diffusion furnace in a case in which the substrates are disposed vertically in a horizontal diffusion furnace.

After being made into a six-layer structure, the piezoelectric precursor film is heat-treated in a diffusion furnace. As shown in FIG. 6, the diffusion furnace is configured such that a reaction gas (in this case, oxygen) is fed into the furnace body 50 through a duct 51 and discharged from the furnace through a duct 52. A plurality of substrates provided with piezoelectric precursor films can be disposed substantially parallel to the oxygen stream in the diffusion furnace. The substrates provided with piezoelectric precursor films are placed in the diffusion furnace and are heat-treated in an oxygen atmosphere (S3). Placing the substrates substantially parallel to the oxygen stream prevents the oxygen stream from being disrupted by the substrates disposed upstream and makes it possible to perform the heat treatment in a uniform manner irrespective of the substrate location. The flow rate of oxygen may be 3 to 10 L/min (for example, about 5 L/min). This is because a flow rate below 3 L/min tends to create oxygen defects in crystals, whereas a flow rate above 10 L/min makes it difficult to control furnace temperature. The heat treatment conditions involve performing the treatment for about 10 to 60 minutes at 500 to 800° C. (for example, about 30 minutes at 700° C.), which is a temperature below that of the high-temperature heat treatment. Such a temperature allows the post-crystallization stoichiometric ratio of elements to be preserved because the lead element in the metal alkoxide solution is prevented from being excessively diffused by heat.

Figure 7:
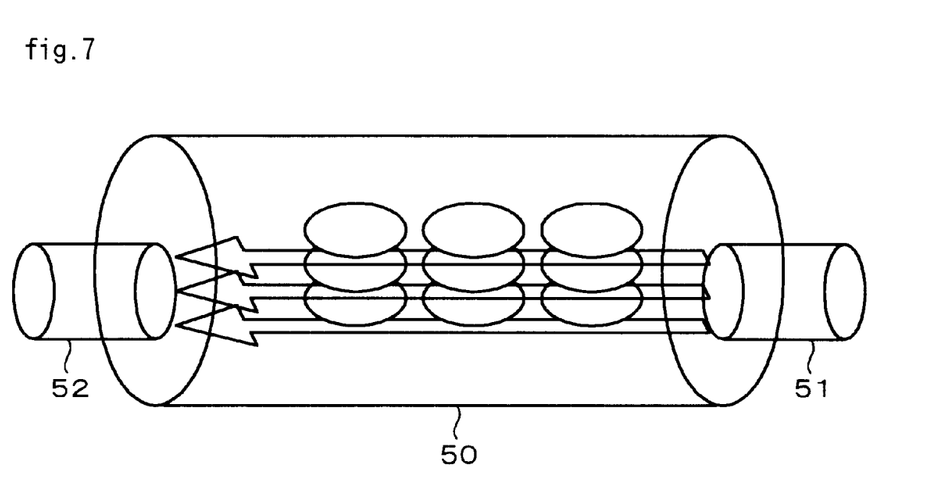
FIG. 7 is a diagram illustrating the relation between the oxygen stream and the substrate position in the step for performing a heat treatment in a diffusion furnace in a case in which the substrates are disposed horizontally in a horizontal diffusion furnace.
Figure 8:
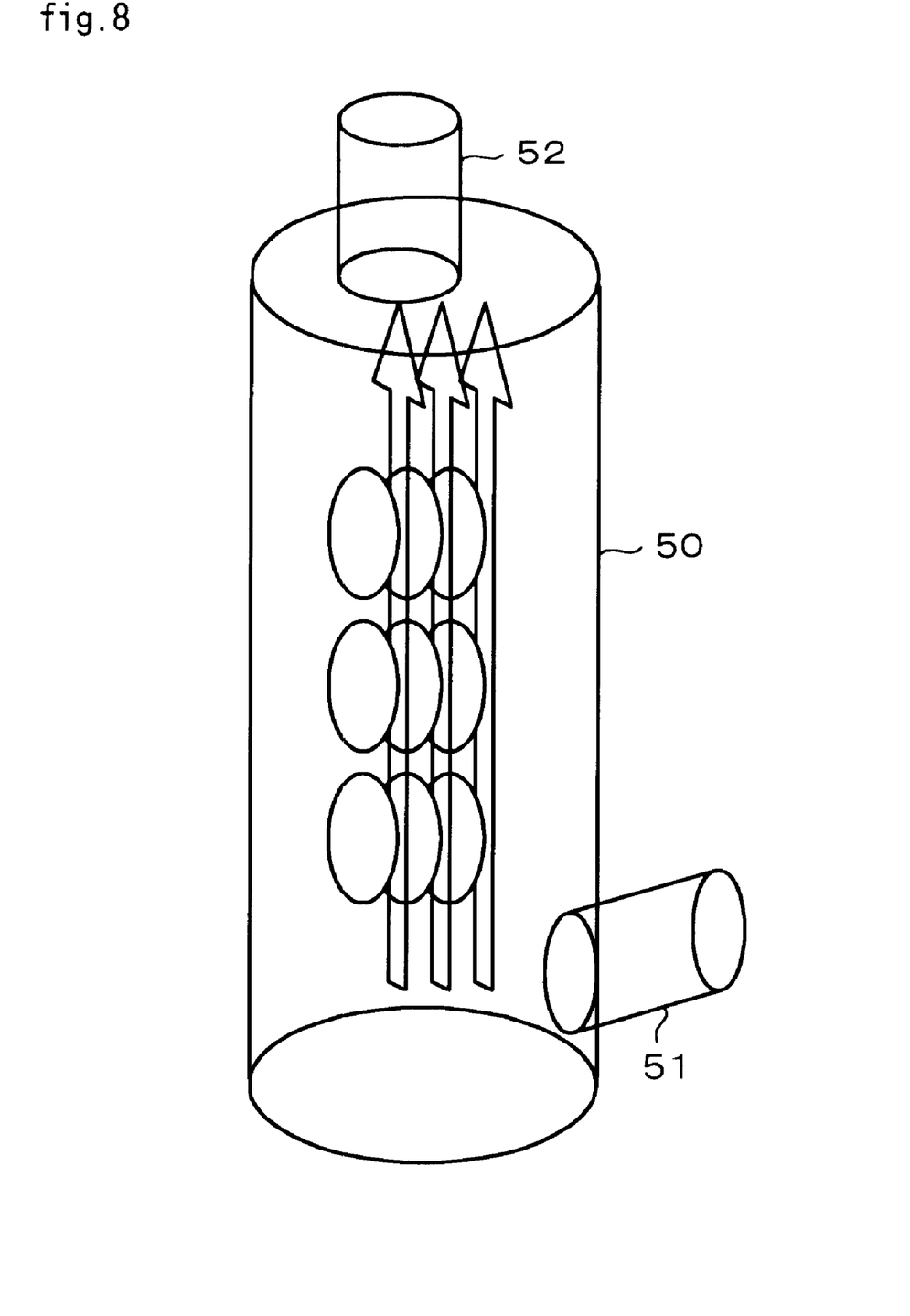
FIG. 8 is a diagram illustrating the relation between the oxygen stream and the substrate position in the step for performing a heat treatment in a diffusion furnace in a case in which the substrates are disposed in a vertical diffusion furnace.

FIG. 6 depicts a case in which the substrates are stood upright inside the diffusion furnace, but placing the substrates horizontally in the diffusion furnace in the manner shown in FIG. 7 is also acceptable as long as the substrates are substantially parallel to the oxygen stream. This arrangement is not limited to horizontal diffusion furnaces and involves cases in which the substrates are disposed substantially parallel to the oxygen stream in a vertical diffusion furnace, as shown in FIG. 8.

As a result of the heat treatment in the diffusion furnace, columnar crystal grains 404 having a perovskite crystal structure develop from the amorphous piezoelectric precursor film, yielding a crystallized heat-treated layer 4021.

After the initial heat-treated layer 4021 has been formed, a layer consisting of six sub-layers is again formed thereon by the coating, drying, and pyrolyzing of a metal alkoxide solution, yielding a fresh piezoelectric precursor film. This piezoelectric precursor film is subjected to a heat treatment in a diffusion furnace in the same manner as above, yielding a heat-treated layer 4022. A prescribed total number of layers (for example, the five heat-treated layers 4021 through 4025) are then formed in the same manner, completing the crystallization of the piezoelectric thin film 402. Fine crystal grains 405 are formed along the borders of the heat-treated layers.

Applying heat to a precursor film of a certain thickness in a common high-speed heat treatment step creates stress and cracking in this film, but the manufacturing method of the present embodiment causes no such cracking. A thicker film can be obtained by crystallizing the film in certain thickness increments.

Performing a high-speed heat treatment instead of the heat treatment in a diffusion furnace may result in the removal of the lead element by the high temperature or cause the material to be damaged by the high temperature. Heat should therefore be applied at a prescribed temperature not exceeding that of a diffusion furnace when a large number of crystallization treatments are performed.

Step for Forming the Top Electrode (S4): Once the piezoelectric thin film 402 is obtained, a top electrode 403 is formed thereon by electron beam vapor deposition, sputtering, or another technique. Platinum, iridium, or the like may be used as the material for the top electrode 403. The thickness thereof is about 100 nm.

With the above-described steps, the primary shaping of the piezoelectric element is completed. Etching this piezoelectric element into an optimal shape that conforms to the operating site to afford a structure in which voltage can be applied between the top and bottom electrodes allows the product to operate as the piezoelectric element of the present invention. In the present embodiment, the stacked structure of the above-described piezoelectric element is etched in conformity with an ink-jet recording head, and the ink-jet recording head is then fabricated by performing the following steps.

Although the drawings below depict a particular cross-sectional structure of three piezoelectric elements, the actual number of piezoelectric elements can be varied in accordance with the resolution of the ink-jet recording head.

Dry Etching Step (S5): In this step, the layered structure of the piezoelectric element obtained by performing the heretofore described steps is dry-etched into an appropriate shape and adjusted to the shape of the piezoelectric element (piezoelectric actuator) 40.

After the layered structure of each piezoelectric element has been formed, the top electrode 403 and the piezoelectric thin film 402 are masked to obtain a configuration that conforms to the shape of the pressure chambers 21, and the periphery thereof is dry-etched.

A resist material of uniform thickness is first applied to the top electrode by spinning, spraying, or another method. The mask is then exposed and developed after being fashioned in the shape of the piezoelectric element, and a resist pattern in formed on the top electrode 403. The product is subjected to common ion milling, dry etching, or the like, and the top electrode 403 and the piezoelectric thin film 402 are etched off and made to conform to the shape of the piezoelectric element 40.

Pressure Chamber Formation Step (S6): In this step, the other side of the pressure chamber substrate 20 provided with the piezoelectric element 40 is etched, yielding pressure chambers 21.

Anisotropic etching, parallel-plate reactive ion etching, or another type of anisotropic wet etching involving the use of active gases can be used to form the pressure chambers. The etched portions serve as pressure chambers 21, and the unetched portions serve as side walls 22.

Nozzle Plate Bonding Step (S7): A nozzle plate 10 is bonded with an adhesive to the etched pressure chamber substrate 20. During bonding, the parts are aligned such that the nozzles 11 are disposed in the spaces of the corresponding pressure chambers 21. The pressure chamber substrate 20 provided with the bonded nozzle plate 10 is mounted in a casing, completing an ink-jet recording head 1. The bonding of the nozzle plate 10 may be substituted by the etching of the nozzle plate and the pressure chamber substrate as a unified structure. No bonding is needed when the components are etched as a unified structure and the nozzle plate and the pressure chamber substrate are manufactured at the same time. Nozzle holes are bored at locations corresponding to the pressure chambers.

The primary structure of the ink-jet recording head 1 can be manufactured by performing the above-described steps. An ink-jet recording head 1 capable of operating as a printing means can be provided by placing the structure into a prescribed casing and allowing ink to be fed. It is also possible to provide a printer in which this ink-jet recording head 1 can operate as a printing means.

EXAMPLES

A piezoelectric thin film composed of a five-tier heat-treated layer was fabricated by the manufacturing method of the present embodiment.

Figure 9:
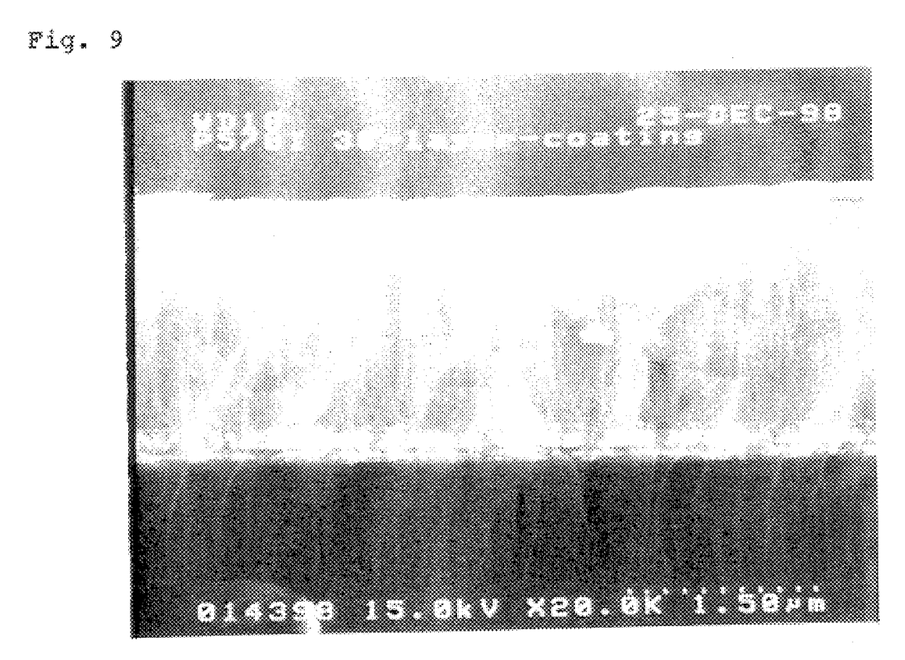
FIG. 9 is a cross-sectional SEM photograph depicting the columnar crystal grains of a piezoelectric thin film according to an embodiment.

FIG. 9 is an SEM photograph depicting the cross-sectional structure of a piezoelectric thin film according to the present embodiment. As can be seen in FIG. 9, the piezoelectric thin film is composed of a collection of columnar crystals in the same way as when the product is formed by a conventional manufacturing method.

Figure 10:
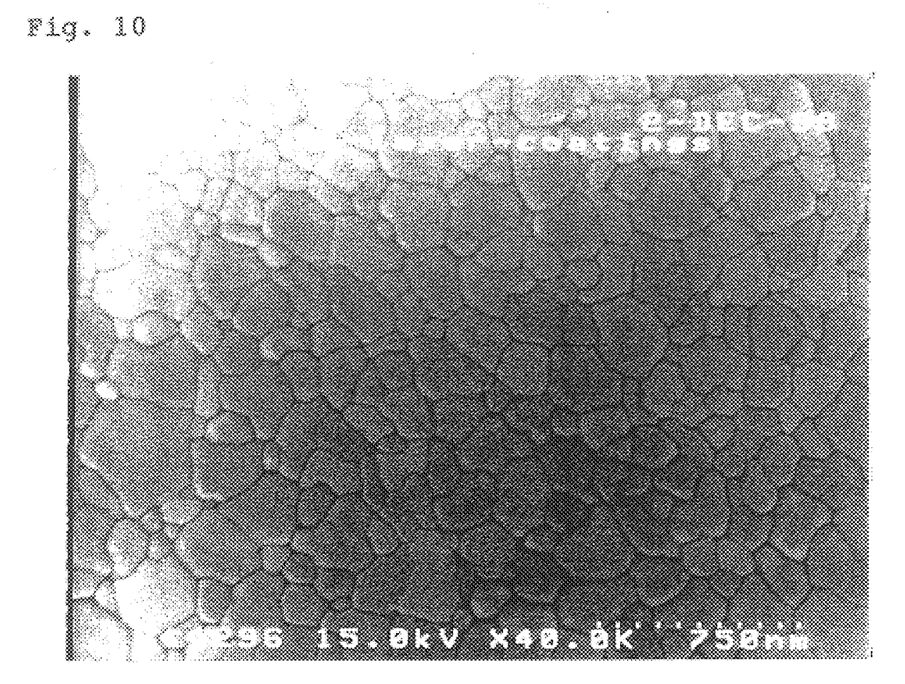
FIG. 10 is an SEM photograph depicting the surface of the piezoelectric thin film pertaining to the embodiment.

FIG. 10 is an SEM photograph obtained by photographing the surface of the piezoelectric thin film pertaining to the present embodiment before the top electrode has been formed. The comparatively large particles are columnar crystal grains.

Figure 11:
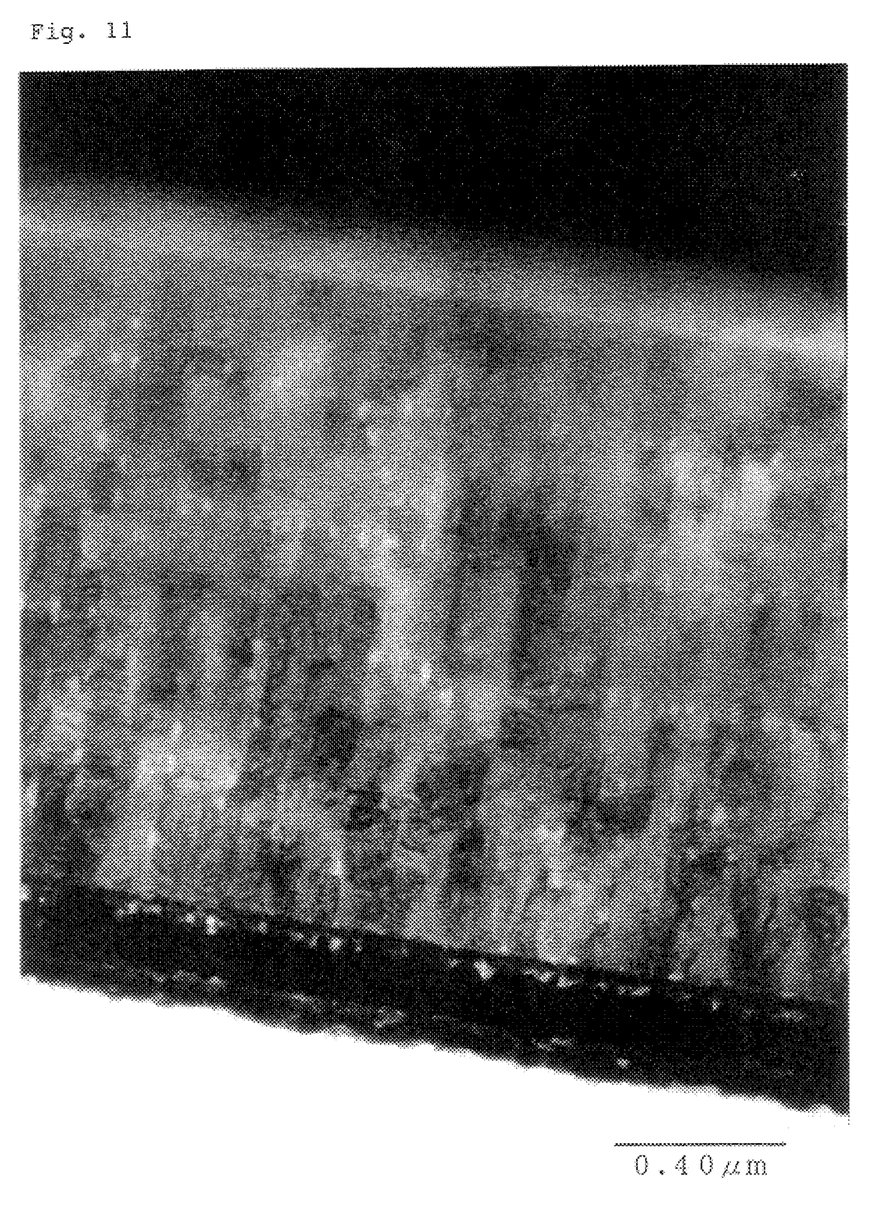
FIG. 11 is a cross-sectional TEM photograph depicting the piezoelectric thin film of the embodiment.
Figure 12:
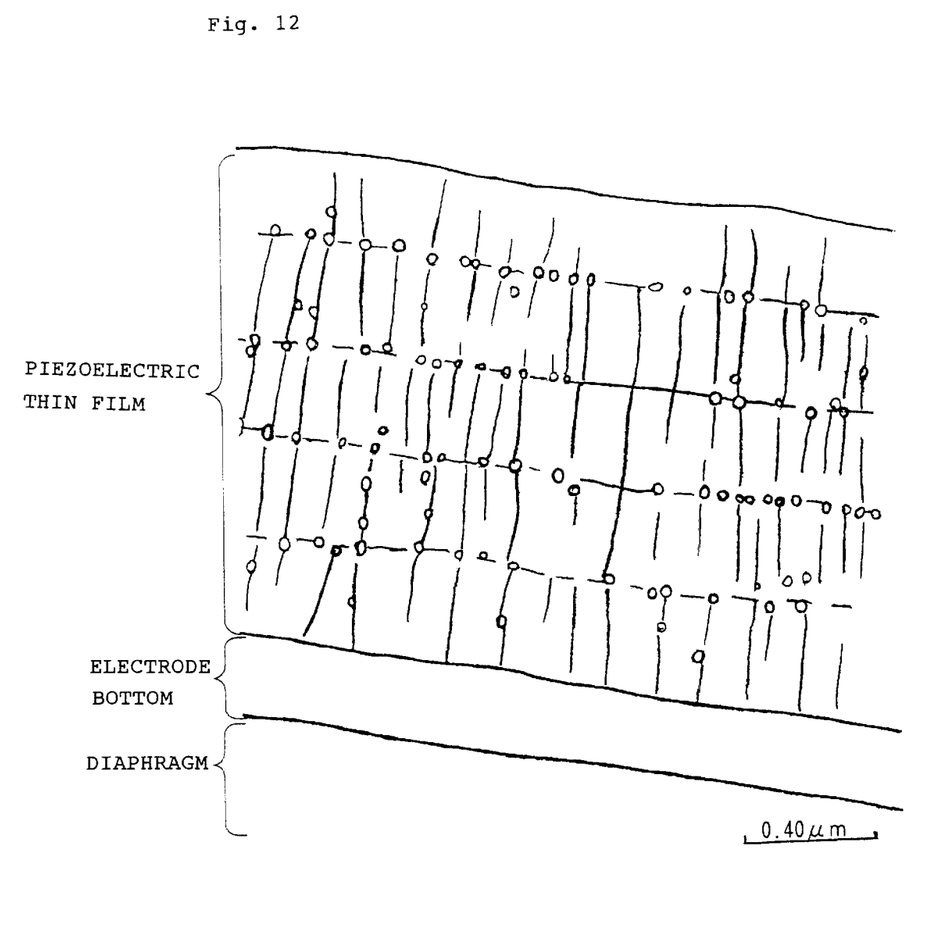
FIG. 12 is a schematic of the photograph in FIG. 11.

FIG. 11 is a TEM cross-sectional photograph depicting the cross-sectional structure of the piezoelectric thin film pertaining to the present embodiment. A schematic thereof is shown in FIG. 12. It can be seen in FIGS. 11 and 12 that each of the heat-treated layers can be easily identified and that the film is composed of columnar crystal grains. Specifically, each columnar crystal grain extends in the direction of film thickness, a plurality of grains are aligned in the direction of film surface to form a layer of columnar crystal grains, and a plurality of such layers of columnar crystal grains are stacked in the direction of film thickness.

It can also be clearly seen that a plurality of fine crystal grains are arranged parallel to the film surface along the borders of the heat-treated layers. In particular, the fine crystal grains are formed along the grain boundaries between the layers of columnar crystal grains, and are disposed along the borders between the layers. Although the photograph of a cross section in the direction of film thickness indicates that the fine crystal grains are shaped as small circles, the fact that the fine crystal grains are disposed along the grain boundaries of the columnar crystal grains in an arbitrary cross section suggests that these fine crystal grains have an annular shape when viewed in a plane.

An examination of high-resolution cross-sectional TEM photographs also revealed the presence of dislocations or lattice strain within an area no more than 20 nm from the borders between the heat-treated layers.

A drive voltage of 25 V was maintained to measure the piezoelectric characteristics (piezoelectric coefficient $d_{31}$) of the piezoelectric element pertaining to the present embodiment and a piezoelectric element (comparative example) manufactured by a conventional manufacturing method (high-speed heat treatment).

Piezoelectric element of the present embodiment:
200 [pC/N] 1.8 µm thickness
Piezoelectric element of comparative example:
180 [pC/N] 1.2 µm thickness
It can clearly be seen from the comparison that the piezoelectric element of the present embodiment has better piezoelectric characteristics. It can also be seen that increased thickness can be obtained with the manufacturing method of the present invention because cracks form when an attempt is made to use the conventional manufacturing method in order to form a piezoelectric thin film in the same thickness as in the present embodiment.

According to the above-described embodiment, the thickness of the piezoelectric thin film can be increased without initiating cracking because the heat treatment in the diffusion furnace is performed in certain thickness increments.

Because the above-described embodiment allows increased thickness to be obtained, it is possible to provide a piezoelectric element having excellent piezoelectric characteristics, as well as an ink-jet recording head and a printer equipped therewith.

The above-described embodiment also entails heat-treating substrates after placing them substantially parallel to the oxygen stream in a diffusion furnace, making it possible to heat-treat all the substrates in a uniform manner without disrupting the oxygen stream. In addition, the substrates can be disposed in high density inside a comparatively narrow furnace, allowing a large number of substrates to be heat-treated.

OTHER MODIFICATIONS

The present invention is not limited by the above-described embodiment and allows various modifications to be made.

For example, a diffusion furnace was used to perform the heat treatment in the above-described embodiment, but any other heat treatment means may also be used as long as the temperature can be readily controlled.

The ink-jet recording head is not subject to any structural limitations, and any structure can be employed as long as it is suitable for a piezo-jet, ink-jet system. Nor is the printer structure limited in any way.

The manufacturing method of the present invention entails performing a heat treatment in a diffusion furnace as a cyclic process in which components are stacked in prescribed thickness increments, making it possible to increase the thickness of the piezoelectric thin film without initiating cracking.

The structure of the present invention can be formed to a greater thickness than in the past without initiating cracking by performing a heat treatment in a diffusion furnace, making it possible to provide a piezoelectric element having excellent piezoelectric characteristics, as well as an ink-jet recording head and printer equipped with this piezoelectric element.

What is claimed is:

1. A piezoelectric element having electromechanical conversion action, wherein the piezoelectric thin film is provided with one or more layers in which fine crystal grains are present in a prescribed minimum density parallel to the film surface and wherein each fine crystal grain has an annular shape.

2. A piezoelectric element having electromechanical conversion action, wherein the piezoelectric thin film has columnar crystal grains and fine crystal grains;

each columnar crystal grain extends in the direction of film thickness, and a plurality thereof are aligned in the direction of film surface, yielding a layer of columnar crystal grains; and a plurality of such columnar crystal grain layers are stacked in the direction of film thickness, yielding layers in which a plurality of fine crystal grains are aligned parallel to the film surface between the layers.

3. A piezoelectric element having electromechanical conversion action as defined in claim 2, wherein said piezoelectric element is such that said fine crystal grains are formed along the grain boundaries between the layers of said columnar crystal grains, and are disposed along the borders between the layers.

4. The piezoelectric element as defined in claim 2, wherein the ratio of the mean grain size of the columnar crystal grains in said piezoelectric thin film to the thickness of the piezoelectric thin film is set to 0.1 or lower.

5. The piezoelectric element as defined in claim 2, wherein the mean grain size of said fine crystal grains is set to 50 nm or less.

6. The piezoelectric element as defined in claim 2, wherein the thickness of the layers containing said fine crystal grains is 50 nm or less for each layer.

7. The piezoelectric element as defined in claim 2, wherein said piezoelectric thin film is provided with lattice defect layers containing dislocations and lattice strain along the layers containing said fine crystal grains.

8. An ink-jet recording head, wherein the piezoelectric element as defined in claim 1 is used as a piezoelectric actuator.

9. A printer, wherein ink-jet recording head as defined in claim 8 is used as a printing means.

10. An ink-jet recording head, wherein the piezoelectric element as defined in claim 2 is used as a piezoelectric actuator.

11. A printer, wherein the ink-jet recording head as defined in claim 10 is used as a printing means.

* * * * *